(12) United States Patent
Kim et al.

(10) Patent No.: US 7,446,577 B2
(45) Date of Patent: Nov. 4, 2008

(54) CURRENT DRIVER WITH OVER-DRIVING FUNCTION IN A SEMICONDUCTOR DEVICE

(75) Inventors: Jae Il Kim, Kyoungki-do (KR); Kang Seol Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/154,870

(22) Filed: Jun. 16, 2005

(65) Prior Publication Data

US 2006/0132195 A1    Jun. 22, 2006

(30) Foreign Application Priority Data

Dec. 22, 2004    (KR)    ............ 10-2004-0110431

(51) Int. Cl.
*H03B 1/00*    (2006.01)
(52) U.S. Cl. .................. 327/109; 327/543; 326/83; 323/354
(58) Field of Classification Search ............. 323/353, 323/354; 326/82, 83; 327/108, 109, 112, 327/538, 541, 543
See application file for complete search history.

(56) References Cited

U.S. PATENT DOCUMENTS

| | | | | |
|---|---|---|---|---|
| 5,457,407 A | * | 10/1995 | Shu et al. | 326/30 |
| 5,589,789 A | * | 12/1996 | Kamiya | 327/278 |
| 5,689,460 A | * | 11/1997 | Ooishi | 365/189.07 |
| 5,783,956 A | * | 7/1998 | Ooishi | 327/157 |
| 5,828,258 A | * | 10/1998 | Ooishi et al. | 327/291 |
| 6,133,749 A | * | 10/2000 | Hansen et al. | 326/30 |
| 6,133,751 A | * | 10/2000 | Churcher et al. | 326/49 |
| 6,157,215 A | * | 12/2000 | Gabara et al. | 326/83 |
| 6,201,420 B1 | * | 3/2001 | Harvey | 327/109 |
| 6,275,077 B1 | * | 8/2001 | Tobin et al. | 327/108 |
| 6,313,670 B1 | * | 11/2001 | Song et al. | 327/108 |
| 6,356,141 B1 | * | 3/2002 | Yamauchi | 327/543 |
| 6,414,516 B1 | * | 7/2002 | Labram et al. | 326/83 |
| 6,424,585 B1 | * | 7/2002 | Ooishi | 365/226 |
| 6,456,124 B1 | * | 9/2002 | Lee et al. | 327/108 |
| 6,466,077 B1 | * | 10/2002 | Miyazaki et al. | 327/534 |
| 6,573,777 B2 | * | 6/2003 | Saint-Laurent et al. | 327/276 |
| 6,686,779 B2 | * | 2/2004 | Yoshikawa | 327/108 |
| 6,717,449 B2 | * | 4/2004 | Tamiya et al. | 327/308 |
| 6,777,976 B2 | * | 8/2004 | Kuge | 326/30 |
| 6,822,502 B2 | * | 11/2004 | Soda | 327/308 |
| 6,853,593 B1 | * | 2/2005 | Bae | 365/189.09 |
| 6,859,404 B1 | * | 2/2005 | Kim | 365/194 |
| 6,922,076 B2 | * | 7/2005 | Braceras et al. | 326/30 |
| 7,015,731 B2 | * | 3/2006 | Seo | 327/112 |
| 7,102,407 B2 | * | 9/2006 | Slawecki | 327/263 |
| 2003/0042940 A1 | * | 3/2003 | Yoshikawa | 327/108 |

FOREIGN PATENT DOCUMENTS

KR    10-2003-0097024    12/2003

\* cited by examiner

*Primary Examiner*—Lincoln Donovan
*Assistant Examiner*—William Hernandez
(74) *Attorney, Agent, or Firm*—Ladas & Parry LLP

(57) ABSTRACT

Disclosed is a controller for driving current of a semiconductor device having an over-driving function, the controller comprising: a load means supplied with an internal voltage; a plurality of switching means, each of which has a first terminal connected to an external voltage and a second terminal connected to the load means, wherein at least one of the plurality of switching means is selectively turned on/off according to an voltage level of the external voltage.

20 Claims, 4 Drawing Sheets

CURRENT DRIVER WITH OVER-DRIVING FUNCTION IN A SEMICONDUCTOR DEVICE

BACKGROUND OF THE INVENTION

1. Field of the invention

The present invention relates to a controller for driving current of a semiconductor device, and more particularly to a controller for driving current of a semiconductor device which can provide a constant amount of current to a memory device although the voltage level of an external voltage applied from an exterior changes.

2. Description of the Prior Art

Semiconductor devices show a tendency of having high integration and using lower power. In order to achieve the high integration of the semiconductor device, the size of internal elements contained in the semiconductor device becomes smaller and smaller. In addition, in order to achieve the low power, the semiconductor device drops an external voltage to a predetermined voltage level by using an internal voltage generation device contained therein, and uses the dropped voltage as a power supply voltage for internal elements. Since the internal elements are driven by such a power supply voltage having a low voltage level, power consumption of the semiconductor device decreases, but the operational speed of the internal elements decrease, thereby deteriorating the driving capability of the semiconductor device.

Also, according to the high integration of the semiconductor device, many internal elements simultaneously operate at one time, so that the driving capabilities of the internal elements are deteriorated when the power supply voltage used for the operations of the internal elements have a low voltage level. In order to prevent the driving capabilities of the internal elements from being deteriorated due to such a low voltage level of the power supply voltage, over-driving for the internal elements of the semiconductor device is performed. That is, when the voltage level of a power supply voltage applied to the internal elements of the semiconductor device is lower than a predetermined voltage level, an external voltage having a higher voltage level than that of the power supply voltage is applied to the internal elements in order to drive the internal elements.

For example, in a read operation of a semiconductor device, when a plurality of sense amplifiers operate at the same time in order to sense data stored in a memory cell, the sense amplifiers consumes a large amount of power in a moment due to the simultaneous operations of the multiple sense amplifiers. When these multiple sense amplifiers operate with a power supply voltage having a low voltage level, the driving capabilities of the multiple sense amplifiers are deteriorated and the voltage level of the power supply voltage is momentarily deteriorated. Also, in an initial read operation of the semiconductor device, when a plurality of sense amplifiers operate at the same time with a power supply voltage having a lower voltage level than a predetermined level, the multiple sense amplifiers cannot normally operate due to the power supply voltage having the lower voltage level than the predetermined level.

In order to solve such a problem, the sense amplifier of the semiconductor device is over-driven when the semiconductor device performs a read operation. That is, when the voltage level of the power supply voltage is lower than a predetermined voltage level, an external voltage having a higher voltage level than the power supply voltage applied to the multiple sense amplifiers. In other words, as shown in FIG. 1, the conventional semiconductor device supplies a power supply voltage Vcore and an external voltage Vdd, which have different voltage levels, to a sense amplification section 110 including a plurality of sense amplifiers 111, 112 and 113. Herein, the external voltage Vdd is a voltage provided from the outside of the semiconductor device, and the power supply voltage Vcore is an internal voltage obtained by dropping the external voltage Vdd to a predetermined voltage level by means of an internal voltage generation device contained in the semiconductor device. In FIG. 1, a first and a second control signal 'sap' and 'san' are signals for operating the sense amplifiers 111, 112 and 113 sensing and amplifying data stored in a memory cell when the semiconductor device performs a read operation. A third control signal 'ovd' is a signal for applying the external voltage Vdd to the sense amplifiers 111, 112 and 113 in order to improve the driving capabilities of the sense amplifiers 111, 112 and 113, when the sense amplifiers 111, 112 and 113 operate at the same time. That is, the third control signal 'ovd' is a signal for over-driving the sense amplifiers 111, 112 and 113.

In other words, when a plurality of sense amplifiers 111, 112 and 113 operate at the same time in order to sense and amplify data stored in a memory cell, the first and second control signals 'sap' and 'san' for operating the sense amplifiers 111, 112 and 113 are applied to a first and a second transmission means 121 and 122. The first control signal 'sap' enables the first transmission means 121 to provide the power supply voltage Vcore to each of the sense amplifiers 111, 112 and 113 of the sense amplification section 110, and the second control signal 'san' enables the second transmission means 122 to connect each of the sense amplifiers 111, 112 and 113 of the sense amplification section 110 to a ground node. Therefore, each of the sense amplifiers 111, 112 and 113 senses and amplifies data stored in the memory cell by the power supply voltage Vcore. In addition, when the third control signal 'ovd' is applied to a third transmission means 123, the third transmission means 123 provides the external voltage Vdd to each of the sense amplifiers 111, 112 and 113 of the sense amplification section 110.

As described above, in a read operation of the semiconductor device, when a plurality of sense amplifiers 111, 112 and 113 operate at the same time in order to sense and amplify data stored in a memory cell, the power supply voltage Vcore and the external voltage Vdd are supplied to each of the sense amplifiers 111, 112 and 113 of the sense amplification section 110 by the first and the third transmission means 121 and 123. As a result, the driving capabilities of the sense amplifiers 111, 112 and 113 are improved, so that the read operation of the semiconductor device is efficiently performed.

However, when the voltage level of the external voltage Vdd provided to the sense amplifiers 111, 112 and 113 through the third transmission means 123 is higher than a voltage level required for the efficient operation of the sense amplifiers 111, 112 and 113, the amount of current 'i1' flowing through a node connecting the first and third transmission means 121 and 123 and the sense amplifiers 111, 112 and 113 rapidly increases. The increase of the current 'i1' cause a noise to cause a malfunction of the sense amplifiers 111, 112 and 113, so that the semiconductor device may malfunction. Also, when the voltage level of the external voltage Vdd is lower than the voltage level required for the efficient operation of the sense amplifiers 111, 112 and 113, the amount of current 'i1' flowing through the node connecting the first and third transmission means 121 and 123 and the sense amplifiers 111, 112 and 113 decreases, thereby deteriorating the driving capabilities of the sense amplifiers 111, 112 and 113. Accordingly, a read operation of the semiconductor device may not be performed smoothly.

As described above, according to the conventional semiconductor device, the amount of current 'i1' applied to the sense amplifiers 111, 112 and 113, which operate with the external voltage Vdd and the power supply voltage Vcore provided thereto, changes depending on the change of the voltage level of the external voltage Vdd. Therefore, the sense amplifiers 111, 112 and 113 may malfunction due to the changing current 'i1'. That is, the amount of current 'i1', which is provided to a load means of the semiconductor device operating with the external voltage Vdd, changes depending on the change of the voltage level of the external voltage Vdd, thereby causing a malfunction of the semiconductor device.

SUMMARY OF THE INVENTION

Accordingly, the present invention has been made to solve the above-mentioned problems occurring in the prior art, and an object of the present invention is to provide a controller for driving current of a semiconductor device which can provide a constant amount of current to a load means although the voltage level of an external voltage changes, thereby preventing a malfunction of the semiconductor device.

In accordance with a first aspect of the present invention in order to accomplish the above objects, there is provided a controller for driving current of a semiconductor device having an over-driving function, the controller comprising: a variable resistance section for receiving an external voltage applied to the semiconductor device and providing current to a load means contained in the semiconductor device.

Herein, the variable resistance section comprises a plurality of resistance means connected in parallel with each other between a node for the external voltage and an input node of the load means.

Preferably, the controller according to the first aspect of the present invention further comprises a detection section for detecting a voltage level of the external voltage to output a control signal, wherein a resistance value of the variable resistance section changes depending on the control signal. Herein, as the voltage level of the external voltage decreases, the resistance value of the variable resistance section controlled by the control signal also decreases. Herein, each of the plurality of resistance means includes a transistor, which is selectively turned on/off by the control signal. In addition, a first terminal of the transistor is connected to the external voltage and a second terminal of the transistor is connected to the load means.

In accordance with a second aspect of the present invention in order to accomplish the above objects, there is provided a controller for driving current of a semiconductor device having an over-driving function, the controller comprising: a load means supplied with an internal voltage; a plurality of switching means, each of which has a first terminal connected to an external voltage and a second terminal connected to the load means, wherein at least one of the plurality of switching means is selectively turned on/off according to an voltage level of the external voltage.

Herein, the number of turned-on switching means from among the plurality of switching means increases as the voltage level of the external voltage becomes lower.

Preferably, the controller according to the second aspect of the present invention further comprises a detection means for detecting the voltage level of the external voltage to output a plurality of control signals, wherein turn on/off of the plurality of switching means is determined according to the plurality of control signals outputted from the detection means.

Herein, the semiconductor device includes a memory device and the load means includes a sense amplifier contained in the memory device.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
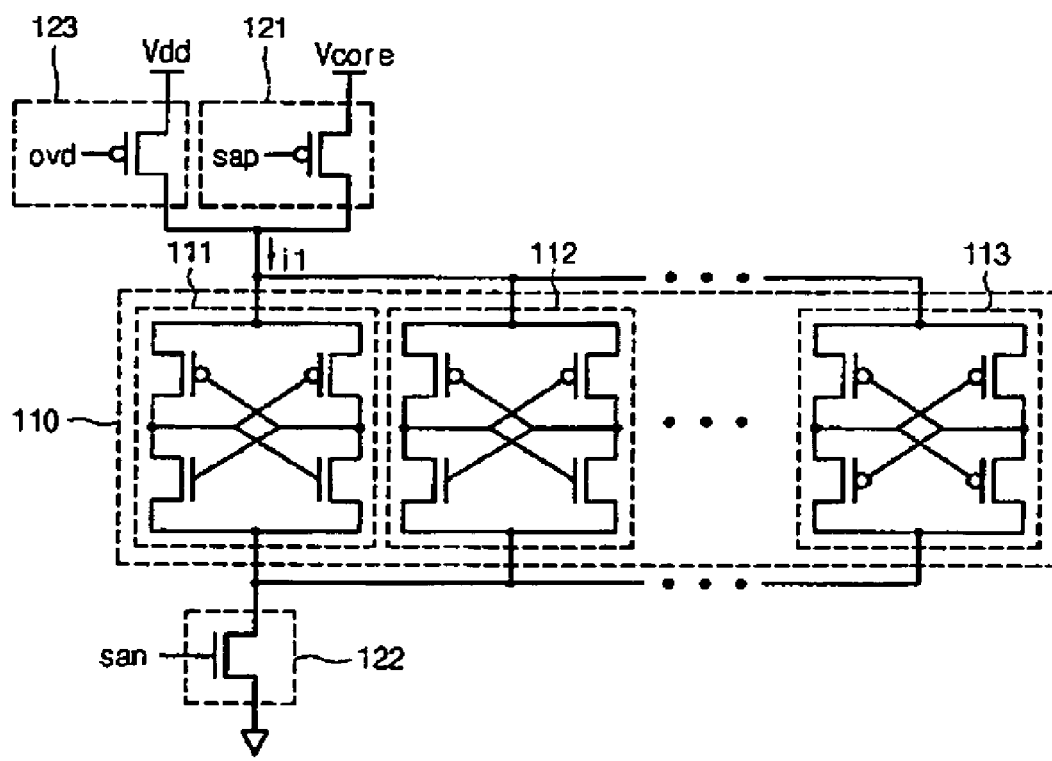
FIG. 1 is a circuit diagram illustrating the conventional controller for driving current of a semiconductor device.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
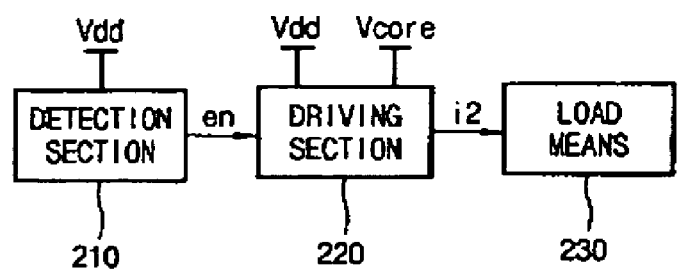
FIG. 2 is a block diagram illustrating a controller for driving current of a semiconductor device according to an embodiment of the present invention.

FIG. 2 is a block diagram illustrating a controller for driving current of a semiconductor device according to the present invention.

The controller for driving current of a semiconductor device according to the present invention includes a detection section 210 and a driving section 220. The detection section 210 detects the voltage level of an external voltage Vdd to output a control signal 'en'. The driving section 220 is supplied with the external voltage Vdd and an internal voltage Vcore and provides a constant amount of current 'i2' to a load means 230 by the control signal 'en'.

The detection section 210 detects the voltage level of the external voltage Vdd provided from an exterior in order to operate the semiconductor device, and applies the control signal 'en' to the driving section 220 according to the voltage level of the external voltage Vdd. The driving section 220 is supplied with the external voltage Vdd and the internal voltage Vcore, which is obtained by dropping the external voltage Vdd to a predetermined voltage level through an internal voltage generation device contained in the semiconductor device in order to be used as a power supply voltage Vcore for internal elements. The driving section 220 applies the constant amount of current 'i2' to the load means 230 of the semiconductor device by the control signal 'en' received from the detection section 210. Herein, the load means 230 represents internal elements of the semiconductor device which operate by the external voltage Vdd and the internal voltage Vcore. The driving capability of the load means 230 is deteriorated when the voltage level of the internal voltage Vcore is lower than a predetermined voltage level. In order to prevent the driving capability of the load means 230 from being deteriorated, over-driving for the load means 230 is performed. That is, the external voltage Vdd having a higher voltage level than that of the internal voltage Vcore is supplied to the load means 230 through the driving section 220, thereby preventing the driving capability of the load means 230 from being deteriorated.

The controller for driving current of the semiconductor device as described above detects the voltage level of the external voltage Vdd through the detection section 210 when the voltage level of the external voltage Vdd provided to the semiconductor device changes. The detection section 210, which has detected a changing voltage level of the external voltage Vdd, outputs an control signal 'en' which has a distinct value depending on the voltage level of the external voltage Vdd. The driving section 220 receives the control signal 'en' which has a value determined depending on the voltage level of the external voltage Vdd, and always applies the constant amount of current 'i2' to the load means 230 of the semiconductor device in response to the control signal 'en'.

Hereinafter, a controller for driving current of a semiconductor device according to an embodiment of the present invention will be described.

Figure 3:
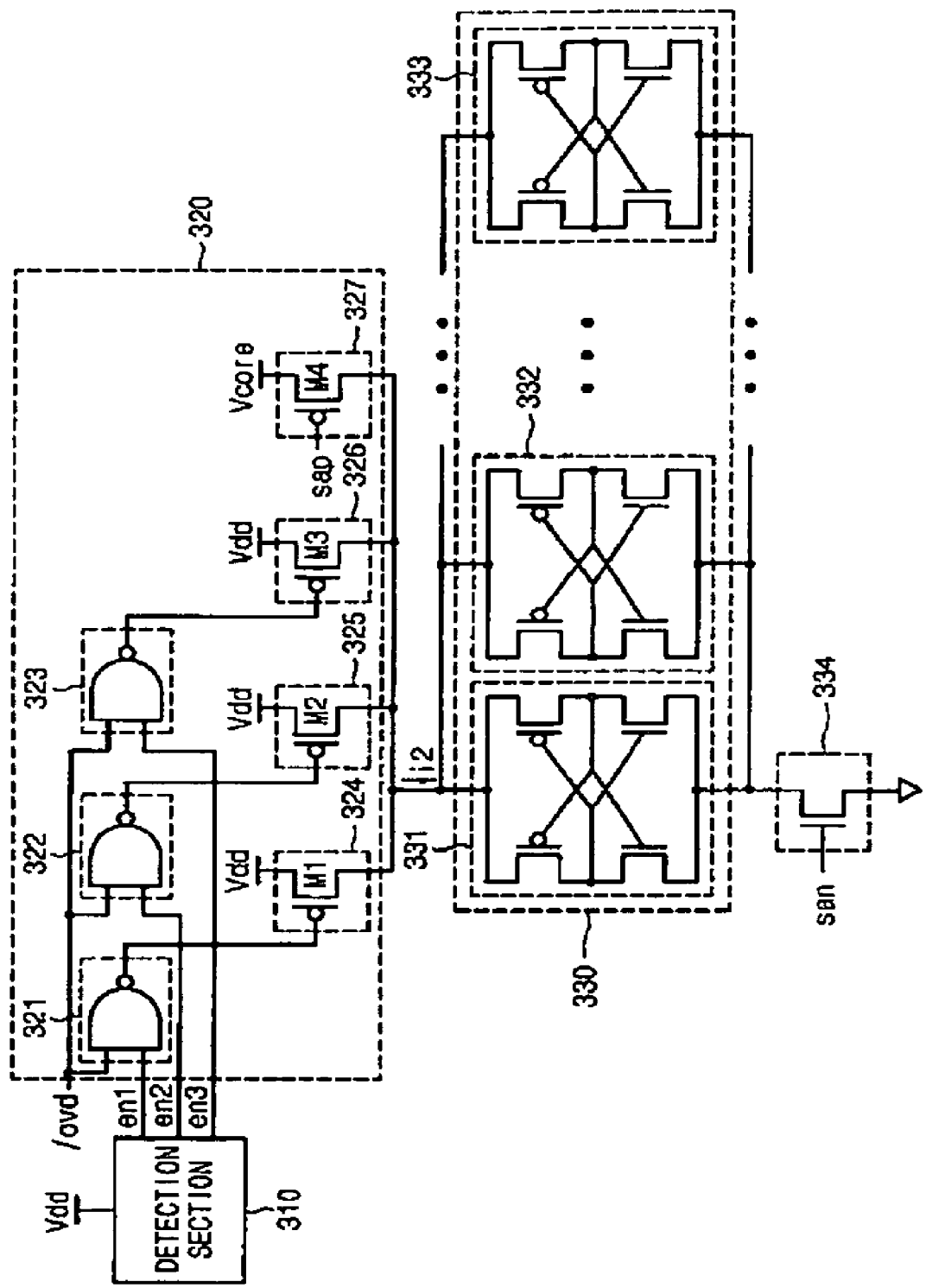
FIG. 3 is a circuit diagram illustrating a controller for driving current of a semiconductor device according to an embodiment of the present invention.

FIG. 3 is a circuit diagram illustrating a controller for driving current of a semiconductor device applied to a sense amplifier of the semiconductor device according to an embodiment of the present invention.

The semiconductor device containing the controller for driving current according to an embodiment of the present invention includes a detection section 310, a driving section 320 and a sense amplification section 330. The detection section 310 detects the voltage level of an external voltage Vdd, and outputs a first, a second and a third control signal 'en1', 'en2' and 'en3' according to the detected voltage level. The driving section 320 is supplied with the external voltage Vdd and an internal voltage Vcore, and receives the control signal 'en1', 'en2' and 'en3' outputted from the detection section 310 and a fourth and a fifth control signal 'sap' and '/ovd'. The driving section 320 generates and applies the constant amount of current 'i2' to the sense amplification section 330. The sense amplification section 330 is a load means of the semiconductor device, and operates by a sixth control signal 'san' and the current 'i2' supplied from the driving section 320. That is, the sense amplification section 330 senses data stored in a memory cell of the semiconductor device by using the sixth control signal 'san' and the current 'i2'.

Herein, the external voltage Vdd is a voltage supplied from the outside of the semiconductor device, and the internal voltage Vcore is a power supply voltage which is obtained by dropping the external voltage Vdd to a predetermined voltage level through an internal voltage generation device contained in the semiconductor device. Also, the fourth and sixth control signals 'sap' and 'san' are signals for operating the sense amplification section 330 to sense data stored in the memory cell when the semiconductor device performs a read operation. The fifth control signal '/ovd' is a signal for ordering the external voltage Vdd to be applied to the sense amplification section 330 in order to improve the driving capability of the sense amplification section 330, when the initial operation of the sense amplification section 330 is performed. That is, the fifth control signal '/ovd' is a signal for over-driving the sense amplification section 330 in order to prevent the driving capability of the sense amplification section 330 from being deteriorated when the voltage level of the internal voltage Vcore is lower than a predetermined voltage level.

The detection section 310 detects the voltage level of the external voltage Vdd and outputs the first, second and third control signals 'en1', 'en2' and 'en3'. The detection section 310 will now be described in detail with reference to FIG. 4.

Figure 4:
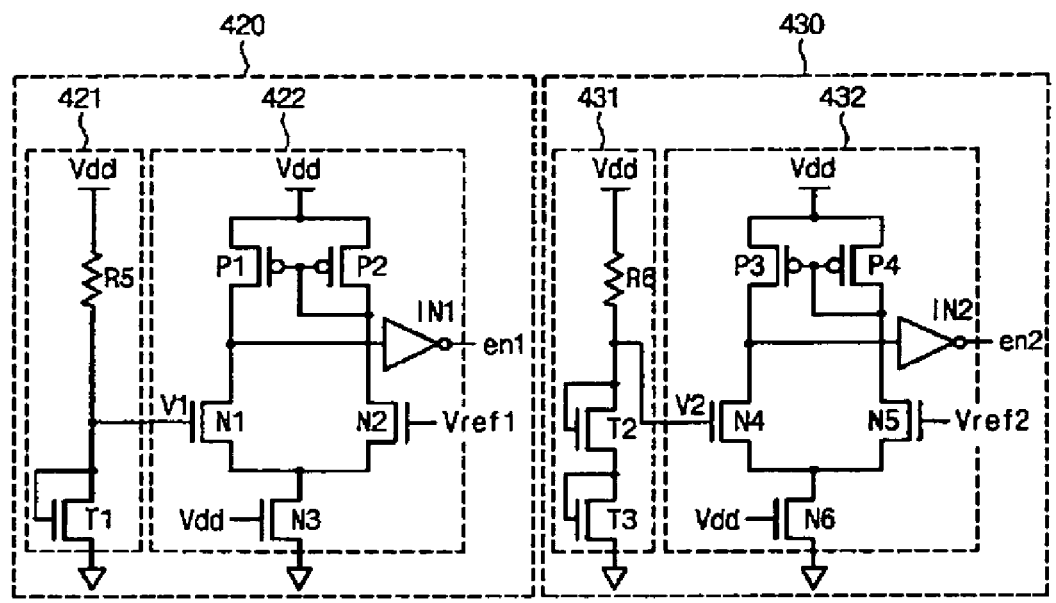
FIG. 4 is a circuit diagram illustrating the detection section of the controller for driving current of a semiconductor device according to an embodiment of the present invention.
Figure 4:
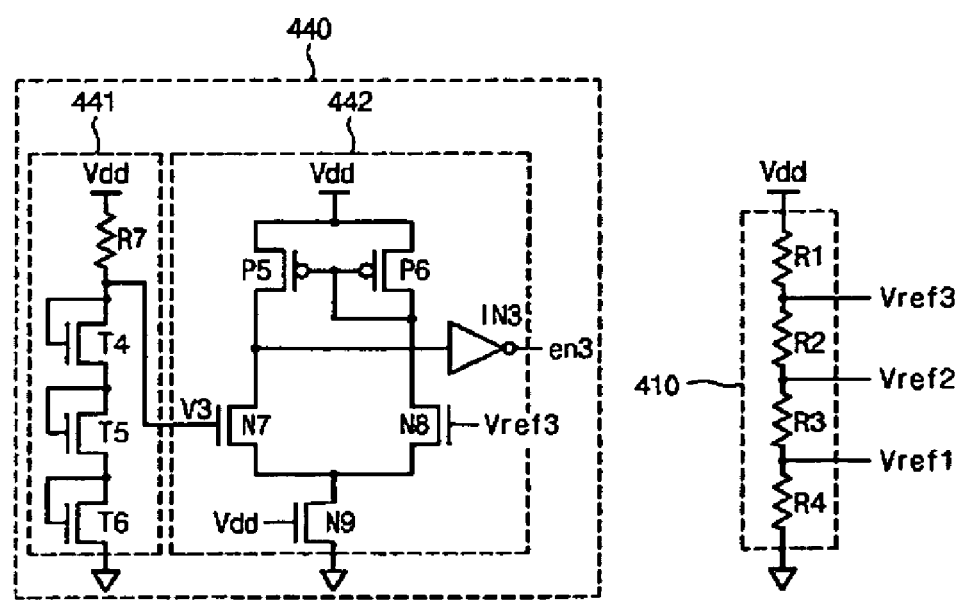

FIG. 4 is a circuit diagram illustrating the detection section 210 of the controller for driving current of a semiconductor device according to an embodiment of the present invention, that is, a circuit diagram illustrating the detection section 310 shown in FIG. 3.

The detection section 310 includes a divider 410, a first, a second and a third detector 420, 430, 440. The divider 410 includes a plurality of resistor elements R1, R2, R3 and R4 which are connected in series between a node for an external voltage Vdd and a ground node. The divider 410 divides a received external voltage Vdd into multiple voltage levels according to resistance ratios among the resistor elements R1, R2, R3 and R4. Each common node between the resistor elements R1, R2, R3 and R4 is connected a distinct output node of the divider 410, so that the divider 410 outputs the voltages of the common nodes. That is, the divider 410 outputs the voltages of the common nodes as a first, a second and a third reference voltage Vref1, Vref2 and Vref3, respectively.

The first, second and third detectors 420, 430, 440 include sensors 421, 431 and 441 and comparators 422, 432 and 442, respectively. The first detector 420 senses the voltage level of an external voltage Vdd by means of the sensor 421. The sensor 421 changes the level of the sensed external voltage Vdd, and applies an output voltage V1 to the comparator 422. The comparator 422 compares the voltage levels between the output voltage V1 of the sensor 421 and the first reference voltage Vref1 received from the divider 410, and outputs a first control signal 'en1'. The first control signal 'en1' outputted from the comparator 422 is applied to the driving section 320.

The sensor 421 includes a resistor element R5 and a diode-type transistor T1 which are connected in series between a reception node for the external voltage Vdd and a ground node. The output voltage V1 of the sensor 421 is a voltage of the common node of the resistor element R5 and the diode-type transistor T1, and has a level equal to that of a threshold voltage Vth of the diode-type transistor T1. The comparator 422 includes PMOS transistors P1 and P2, NMOS transistors N1, N2 and N3, and an inverter IN1, which are connected in a current mirror fashion between a node for the external voltage Vdd and a ground node. The comparator 422 is enabled when the external voltage Vdd is applied to the NMOS transistor N3 connected to the ground node. The comparator 422 enabled as described above compares the voltage levels between the first reference voltage Vref1 and the output voltage V1 of the sensor 421, which has a level (Vth) equal to that of the threshold voltage Vth, and outputs the first control signal 'en1'.

The second detector 430 senses the voltage level of an external voltage Vdd by means of the sensor 431. The sensor 431 changes the level of the sensed external voltage Vdd and applies an output voltage V2 to the comparator 432. The comparator 432 compares the voltage levels between the output voltage V2 of the sensor 431 and the second reference voltage Vref2 received from the divider 410, and outputs a second control signal 'en2'. The second control signal 'en2' outputted from the comparator 432 is applied to the driving section 320.

The sensor 431 includes a resistor element R6 and two diode-type transistors T2 and T3, which are connected in series between a reception node for the external voltage Vdd and a ground node. The output voltage V2 of the sensor 431 is a voltage of the common node of the resistor element R6 and the diode-type transistor T2, and has a voltage level (2 Vth) two times higher than that of each threshold voltage Vth of the diode-type transistors T2 and T3. The comparator 432 includes PMOS transistors P3 and P4, NMOS transistors N4, N5 and N6, and an inverter IN2, which are connected in a current mirror fashion between a node for the external voltage Vdd and a ground node. The comparator 432 is enabled when the external voltage Vdd is applied to the NMOS transistor N6 connected to the ground node. The comparator 432 enabled as described above compares the voltage levels between the second reference voltage Vref2 and the output voltage V2 of the sensor 431, which has a voltage level (2 Vth) two times higher than that of each threshold voltage Vth of the diode-type transistors T2 and T3, and outputs the -second control signal 'en2'.

The third detector 440 senses the voltage level of an external voltage Vdd by means of the sensor 441. The sensor 441 changes the level of the sensed external voltage Vdd and applies an output voltage V3 to the comparator 442. The comparator 442 compares the voltage levels between the output voltage V3 of the sensor 441 and the third reference voltage Vref3 received from the divider 410, and outputs a third control signal 'en3'. The third control signal 'en3' outputted from the comparator 442 is applied to the driving section 320.

The sensor 441 includes a resistor element R7 and three diode-type transistors T4, T5 and T6, which are connected in series between a reception node for the external voltage Vdd and a ground node. The output voltage V3 of the sensor 441 is a voltage of the common node of the resistor element R7 and the diode-type transistor T4, and has a voltage level 3 Vth two times higher than that of each threshold voltage Vth of the diode-type transistors T4, T5 and T6. The comparator 442 includes PMOS transistors P5 and P6, NMOS transistors N7, N8 and N9, and an inverter IN3, which are connected in a current mirror fashion between a node for the external voltage Vdd and a ground node. The comparator 442 is enabled when the external voltage Vdd is applied to the NMOS transistor N9 connected to the ground node. The comparator 442 enabled as described above compares the voltage levels between the third reference voltage Vref3 and the output voltage V3 of the sensor 441, which has a level (3 Vth) three times higher than that of each threshold voltage Vth of the diode-type transistors T4, T5 and T6, and outputs the third control signal 'en3'.

The driving section 320 includes control means 321, 322 and 323 and transmission means 324, 325, 326 and 327. The control means 321, 322 and 323 receives the fifth control signal '/ovd', and also receives the first, the second and the third control signal 'en1', 'en2' and 'en3' from the detection section 310, respectively. The output signals of the control means 321, 322 and 323 are applied to the transmission means 324, 325 and 326 in order to enable the transmission means 324, 325 and 326, respectively. The transmission means 324, 325 and 326 are connected in parallel with each other between a node for the external voltage Vdd and an input node of the sense amplification section 330. Also, the other transmission means 327 is connected between a node for the internal voltage Vcore and the input node of the sense amplification section 330. That is, the transmission means 324, 325, 326 and 327 are connected in parallel to input node of the sense amplification section 330, respectively. The transmission means 324, 325 and 326 connected to the node for the external voltage Vdd is enabled by output signals of the control means 321, 322 and 323, respectively, and the transmission means 327 connected to the node for the internal voltage Vcore is enabled by the fourth control signal 'sap'.

Such transmission means 324, 325, 326 and 327 include transistors M1, M2, M3 and M4, respectively, and signals for enabling the transmission means 324, 325, 326 and 327 are applied to gate terminals of the transistors M1, M2, M3 and M4, respectively. Each of the tr transistors M1, M2, M3 and M4 is enabled to perform a resistor function. That is, when each of the transmission means 324, 325, 326 and 327 is enabled, each of the transistors M1, M2, M3 and M4 contained in the transmission means 324, 325, 326 and 327 functions as an active resistor. When the transistors M1, M2, M3 and M4 have an equal size, the resistance values of the transistors are equal to each other. As a result, the transmission means 324, 325 and 326 connected to the external voltage Vdd generate current by the external voltage Vdd and the resistance values of the transistors M1, M2 and M3. Also, the transmission means 327 connected to the internal voltage Vcore generates current by the resistance value of the transistor M4 and the internal voltage Vcore.

Herein, since the transmission means 327 connected to the internal voltage Vcore is enabled by the fourth control signal 'sap', the transmission means 327 is always enabled in a read operation of the semiconductor device. Therefore, the transmission means 327 generates a constant amount of current at all times by the internal voltage Vcore and the resistance value of the transistor M4. The transmission means 324, 325 and 326 connected to the node for the external voltage Vdd are enabled by output signals of the control means 321, 322 and 323, that is, by the control signals 'en1', 'en2', and 'en3' applied from the detection section 310, respectively. Therefore, the transmission means 324, 325 and 326 are individually enabled depending on the voltage level of the external voltage Vdd, thereby changing the number of transistors connected to the external voltage Vdd from among the transistors M1, M2, M3 and M4. Such change of the number of connected transistors causes the change of the resistance value of the transmission means 324, 325 and 326, so that the resistor value of the transmission means 324, 325 and 326 changes depending on the voltage level of the external voltage Vdd. That is, when the voltage level of the external voltage Vdd changes, the resistance value caused by the transmission means 324, 325 and 326 connected to the node of the external voltage Vdd changes depending on the changed voltage level of the external voltage Vdd, so that the amount of current generated by the external voltage Vdd and the resistance value is always kept uniform.

The constant amount of current 'i2' generated from the transmission means 324, 325, 326 and 327 is supplied to the sense amplification section 330 through a single node.

The sense amplification section 330 includes a plurality of sense amplifiers 331, 332 and 333 and a transmission means 334. The sense amplifiers 331, 332 and 333 sense and amplify data stored in the memory cell of the semiconductor device when the read operation of the semiconductor device is performed. The transmission means 334 is enabled by the sixth control signal 'san' when the read operation of the semiconductor device is performed. When the transmission means 334 is enabled, the transmission means 334 connects the sense amplifiers 331, 332 and 333 to a ground node, thereby enabling the sense amplifiers 331, 332 and 333.

Hereinafter, the operation of the controller for driving current of a semiconductor device according to an embodiment of the present invention will be described in relation to various voltage levels of the external voltage Vdd in a read operation of the semiconductor device.

Figure 5:
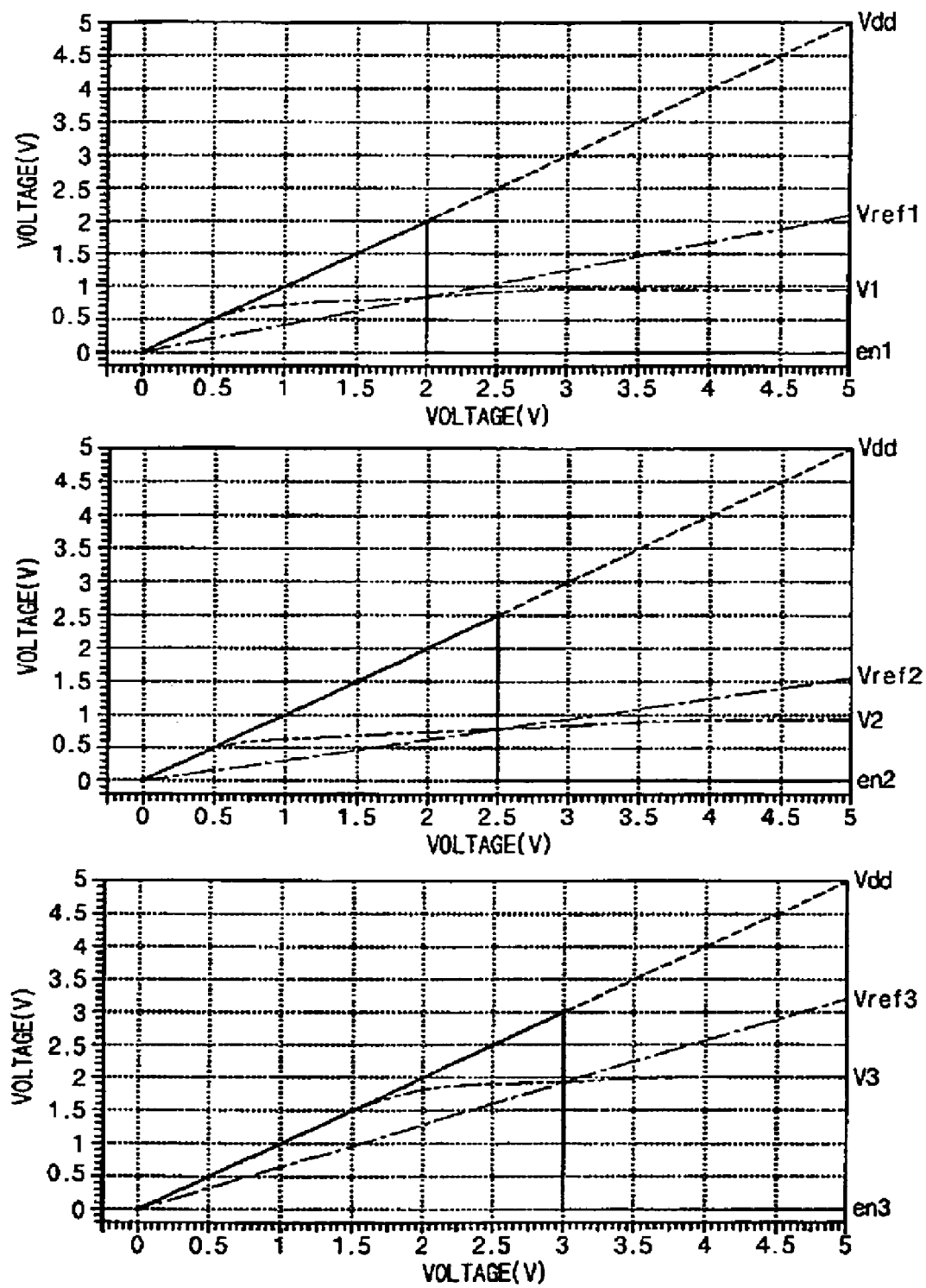
FIG. 5 is graphs showing waveform for explaining the operation of the detection section shown in FIG. 4.

FIG. 5 is graphs showing waveform for explaining the operation of the detection section 310 based on the voltage level of the external voltage Vdd.

When the semiconductor device performs an initial read operation, the higher the voltage level of the external voltage Vdd is, the higher the voltage levels of the first, second and third reference voltages Vref1, Vref2 and Vref3 (which is outputs voltages of the divider 410 contained in the detection section 310) are. The first detector 420 outputs the first control signal 'en1' having a voltage level equal to that of an external voltage Vdd when the voltage level of the external voltage Vdd is equal to or lower than 2.0 V. The second detector 430 outputs the second control signal 'en2' having a voltage level equal to that of an external voltage Vdd when the voltage level of the external voltage Vdd is equal to or lower than 2.5 V. Also, the third detector 440 outputs the third control signal 'en3' having a voltage level equal to that of an external voltage Vdd when the voltage level of the external voltage Vdd is equal to or lower than 3.0 V. Herein, the maximum output voltages V1, V2 and V3 of the sensors 421, 431 and 441 contained in the detectors 420, 430 and 440 have voltage levels one-time (Vth) two-times (2 Vth) and three-times (3 Vth) higher respectively than each threshold voltage (Vth) of the diode-type transistors T1, T2, T3, T4, T5 and T6.

When the detection section 310 operates based on the voltage level of the external voltage Vdd as described above, the driving section 320 receives the output signals 'en1', 'en2' and 'en3' of the detection section 310 and the fourth and fifth control signals 'sap' and '/ovd'. That is, the driving section 320 receives the first, second and third control signals 'en1', 'en2' and 'en3' from the detection section 310 and receives the fourth and fifth control signals 'sap' and '/ovd'.

Herein, when the voltage level of an external voltage Vdd is equal to or lower than 2.0 V, all of the first, second and third control signals 'en1', 'en2' and 'en3' outputted from the detection section 310 have a voltage level equal to that of the external voltage Vdd. These first, second and third control signals 'en1', 'en2' and 'en3' are applied to the control means 321, 322 and 323 of the driving section 320, respectively. The control means 321, 322 and 323 receive the fifth control signal '/ovd' in addition to the control signals 'en1', 'en2' and 'en3', and apply their output signals to the transmission means 324, 325 and 326, respectively. Accordingly, all of the transmission means 324, 325 and 326 connected to the nodes for the external voltage Vdd are enabled, and the transmission means 327 connected to the internal voltage Vcore is enabled by the fourth control signal 'sap'. As a result, all the transistors M1, M2, M3 and M4 contained in the transmission means 324, 325, 326 and 327 of the driving section 320 function as resistors, thereby providing the constant amount of current 'i2' to the sense amplification section 330 according to the active values of the transistors M1, M2, M3 and M4, the external voltage Vdd and the internal voltage Vcore. Herein, when the transistors M1, M2, M3 and M4 have an equal value, their resistance values are equal. As a result, the transmission means 324, 325 and 326 connected to the nodes for the external voltage Vdd generate current of equal magnitude.

When the voltage level of an external voltage Vdd is from 2.0 V to 2.5 V, only the second and third control signals en2' and 'en3' from among the first, second and third control signals 'en1', 'en2' and 'en3' outputted from the detection section 310 have a voltage level equal to that of the external voltage Vdd. These first, second and third control signals 'en1', 'en2' and 'en3' are applied to the control means 321, 322 and 323 of the driving section 320, respectively. The control means 321, 322 and 323 receive the fifth control signal '/ovd' in addition to the control signals 'en1', 'en2' and 'en3', and apply their output signals to the transmission means 324, 325 and 326, respectively. Accordingly, only two transmission means 325 and 326 are enabled from among the transmission means 324, 325 and 326 connected to the nodes for the external voltage Vdd, and the transmission means 327 connected to the internal voltage Vcore is enabled by the fourth control signal 'sap'. As a result, from among the transistors M1, M2, M3 and M4 contained in the transmission means 324, 325, 326 and 327 of the driving section 320, only the transistors M2, M3 and M4 contained in three transmission means 325, 326 and 327 function as resistors.

By the resistance values of the transistors M2, M3 and M4 functioning as active resistors as described above, the external voltage Vdd and the internal voltage Vcore, the constant amount of current 'i2' is provided to the sense amplification section 330. In other words, current generated by the internal voltage Vcore and the resistance values of the transistor M4 has the same value as that of the previous case in which the voltage level of the external voltage Vdd is equal to or lower than 2.0 V. Also, current generated by the external voltage Vdd and the resistance values of the two transistors M2 and M3 has the same value as that of the previous case in which the voltage level of the external voltage Vdd is equal to or lower than 2.0 V. When the voltage level of the external voltage Vdd increases, the number of transistors functioning as an active resistor decreases from three (M2, M3 and M4) to two (M3 and M4) Accordingly, although the voltage level of the external voltage Vdd changes, current generated by the external voltage Vdd and the resistance values of active resistors is kept uniform.

When the voltage level of an external voltage Vdd is equal to or higher than 3.0 V, all of the first, second and third control signals 'en1', 'en2' and 'en3' outputted from the detection section 310 have low levels. These first, second and third control signals 'en1', 'en2' and 'en3' are applied to the control means 321, 322 and 323 of the driving section 320, respectively. The control means 321, 322 and 323 receive the fifth control signal '/ovd' in addition to the control signals 'en1', 'en2' and 'en3', and apply their output signals to the transmission means 324, 325 and 326, respectively. Accordingly, all of the transmission means 324, 325 and 326 connected to the nodes for the external voltage Vdd are disenabled, and the transmission means 327 connected to the internal voltage Vcore is enabled by the fourth control signal 'sap'. As a result, from among the transistors M1, M2, M3 and M4 contained in the transmission means 324, 325, 326 and 327 of the driving section 320, only the transistor M4 connected to the node for the internal voltage Vcore functions as a resistor. By the resistance value of the transistor M4 functioning as an active resistor as described above and the internal voltage Vcore, the constant amount of current 'i2' is provided to the sense amplification section 330. That is, in a read operation of the semiconductor device, when the external voltage Vdd has a voltage level equal to or higher than a predetermined voltage level, the sense amplification section 330 is supplied with only the internal voltage Vcore, so that the sense amplification section 330 can efficiently sense and amplify data stored in the memory cell by using the internal voltage Vcore.

According to the controller for driving current of the semiconductor device in accordance with the present invention, the detection section 310 detects the voltage level of the external voltage Vdd to output control signals 'en', and the magnitude of resistance of the driving section 220 to which the external voltage Vdd is applied is determined by the control signals 'en'. Therefore, the driving section 220 can provide the constant amount of current 'i2' to the load means 230 of the semiconductor device although the voltage level of the external voltage Vdd changes.

As described above, according to the controller of the present invention, the voltage level of an external voltage applied to the semiconductor device is detected to generate a control signal. Also, a constant amount of current is provided to the load means of the semiconductor device by the generated control signal, so that it is possible to provide the constant amount of current to the load means although the voltage level of the external voltage changes. As a result, a malfunction of the semiconductor device can be prevented.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A controller for driving current to a load comprising a sense amplification section in a semiconductor device having an over-driving function, the controller comprising:
    a detection section for detecting a voltage level of an external voltage to output a control signal to a variable resistance section to control its resistance and
    a driving section having the variable resistance section for receiving the external voltage applied to the semiconductor device and providing substantially constant current to the load comprising a sense amplification section by varying the total resistance of the variable resistance section in response to changing external voltage level.

2. The controller as claimed in claim 1, wherein the variable resistance section comprises a plurality of resistance elements connected in parallel with each other between a node for the external voltage and an input node of the load comprising a sense amplification section.

3. The controller as claimed in claim 1, wherein, as the voltage level of the external voltage decreases, the resistance of the variable resistance section controlled by the control signal also decreases.

4. The controller as claimed in claim 1, wherein the detection section comprising:
    a divider including a plurality of resistor elements and
    a plurality of detector including sensors sensing the voltage level of an external voltage and comparators comparing the voltage levels between the output voltage of the sensor and the output voltage of the divider.

5. The controller as claimed in claim 2, wherein each of the plurality of resistance elements includes a transistor, which is selectively turned on or off by the control signal.

6. The controller as claimed in claim 5, wherein a first terminal of the transistor is connected to the external voltage and a second terminal of the transistor is connected to the load comprising a sense amplification section.

7. A controller for driving current of a semiconductor device having an over-driving function, the controller comprising:
    a load comprising a sense amplification section supplied with an internal voltage obtained by dropping an external voltage to a predetermined level;
    a plurality of switching elements, each having a resistance and each having a first terminal connected to the external voltage and a second terminal connected to the load comprising a sense amplification section; and
    a detection circuit detecting the voltage level of the external voltage to output a plurality of control signals,
    wherein at least one of the plurality of switching elements is selectively turned on or off according to a voltage level of the external voltage such that the current provided to the load comprising a sense amplification section is substantially constant and
    turning on or off one or more of the plurality of switching elements is determined according to the plurality of control signals outputted from the detection circuit.

8. The controller as claimed in claim 7, wherein the number of turned-on switching elements from among the plurality of switching elements increases as the voltage level of the external voltage decreases.

9. The controller as claimed in claim 7, wherein the detection section comprises:
    a divider including a plurality of resistor elements and
    a plurality of detector including sensors sensing the voltage level of an external voltage and comparators comparing the voltage levels between the output voltage of the sensor and the output voltage of the divider.

10. The controller as claimed in claim 7, wherein the semiconductor device includes a memory device and the load comprising a sense amplification section includes a sense amplifier contained in the memory device.

11. The controller as claimed in claim 7, wherein the load comprising a sense amplification section comprises a sense amplification circuit.

12. A controller for driving current to a load comprising a sense amplification section in a semiconductor memory device having an over-driving function, the controller comprising:
    a detection section for detecting a voltage level of an external voltage to output a control signal to a variable resistance section to control its resistance and
    a driving section having the variable resistance section for receiving the external voltage applied to the semiconductor memory device and providing substantially constant current to the load comprising a sense amplification section by varying the total resistance of the variable resistance section in response to changing external voltage level.

13. The controller as claimed in claim 12, wherein the variable resistance section comprises a plurality of resistance elements connected in parallel with each other between a node for the external voltage and an input node of the load comprising a sense amplification section.

14. The controller as claimed in claim 12, wherein the detection section comprising:
    a divider including a plurality of resistor elements and a plurality of detector including sensors sensing the voltage level of an external voltage and comparators comparing the voltage levels between the output voltage of the sensor and the output voltage of the divider.

15. The controller as claimed in claim 12, wherein, as the voltage level of the external voltage decreases, the resistance of the variable resistance section controlled by the control signal also decreases.

16. The controller as claimed in claim 13, wherein each of the plurality of resistance elements includes a transistor, which is selectively turned on or off by the control signal.

17. The controller as claimed in claim 16, wherein a first terminal of the transistor is connected to the external voltage and a second terminal of the transistor is connected to the load comprising a sense amplification section.

18. A controller for driving current of a semiconductor memory device having an over-driving function, the controller comprising:
    a load comprising a sense amplification section supplied with an internal voltage obtained by dropping an external voltage to a predetermined level;
    a plurality of switching elements, each having a resistance and each having a first terminal connected to the external voltage and a second terminal connected to the load comprising a sense amplification section; and
    a detection circuit detecting the voltage level of the external voltage to output a plurality of control signals, wherein at least one of the plurality of switching elements is selectively turned on or off according a voltage level of the external voltage such that the current provided to the load comprising a sense amplification section is substantially constant and turning on or off one or more of the plurality of switching elements is determined according to the plurality of control signals outputted from the detection circuit.

19. The controller as claimed in claim 18, wherein the number of turned-on switching elements from among the plurality of switching elements increases as the voltage level of the external voltage decreases.

20. The controller as claimed in claim 18, wherein the detection section comprising:
 a divider including a plurality of resistor elements and
 a plurality of detector including sensors sensing the voltage level of an external voltage and comparators comparing the voltage levels between the output voltage of the sensor and the output voltage of the divider.

* * * * *